(12) United States Patent
Hara et al.

(10) Patent No.: US 9,577,054 B2
(45) Date of Patent: Feb. 21, 2017

(54) SEMICONDUCTOR DEVICE WITH VARIED ELECTRODES

(71) Applicant: KABUSHIKI KAISHA TOSHIBA, Tokyo (JP)

(72) Inventors: Takuma Hara, Kanazawa Ishikawa (JP); Tetsuro Nozu, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/818,988

(22) Filed: Aug. 5, 2015

(65) Prior Publication Data

US 2016/0225862 A1    Aug. 4, 2016

(30) Foreign Application Priority Data

Feb. 3, 2015    (JP) .................................. 2015-019163

(51) Int. Cl.
*H01L 29/40* (2006.01)
*H01L 29/78* (2006.01)
(Continued)

(52) U.S. Cl.
CPC ........... *H01L 29/404* (2013.01); *H01L 27/088* (2013.01); *H01L 29/1095* (2013.01); *H01L 29/407* (2013.01); *H01L 29/4236* (2013.01); *H01L 29/4238* (2013.01); *H01L 29/42376* (2013.01); *H01L 29/7397* (2013.01); *H01L 29/7811* (2013.01); *H01L 29/7813* (2013.01); *H01L 29/7827* (2013.01)

(58) Field of Classification Search
CPC .. H01L 29/404; H01L 29/7827; H01L 27/088; H01L 29/4236
See application file for complete search history.

(56) References Cited

U.S. PATENT DOCUMENTS

| | | | |
|---|---|---|---|
| 7,507,630 B2 | 3/2009 | Tsuchitani et al. | |
| 2012/0326207 A1* | 12/2012 | Yoshimochi | .......... H01L 29/866 257/139 |
| 2015/0214300 A1* | 7/2015 | Barletta | .............. H01L 29/7827 257/330 |

FOREIGN PATENT DOCUMENTS

| | | | |
|---|---|---|---|
| JP | 2001024193 A | * | 1/2001 |
| JP | 2008251710 A | | 10/2008 |

OTHER PUBLICATIONS

Shinya Soneda et al., Analysis of a Drain-Voltage Oscillation of MOSFET under High dV/dt UIS Condition, Proceedings of the 2012 24th International Symposium on Power Semiconductor Devices and ICs Jun. 3-7, 2012—Bruges, Belgium, IEEE, pp. 153-156.

* cited by examiner

*Primary Examiner* — Marc Armand
*Assistant Examiner* — Sue Tang
(74) *Attorney, Agent, or Firm* — Patterson & Sheridan, LLP

(57) ABSTRACT

A semiconductor device comprises an element region and a terminal region that surrounds the element region. The semiconductor device includes a first semiconductor region having a first conductivity type and a second semiconductor region having a second conductivity type and provided on the first semiconductor region. A third semiconductor region having the first conductivity type is provided on the second semiconductor region. A first electrode is electrically connected to the first semiconductor region. A second electrode is electrically connected to the third semiconductor region. A third and a fourth electrode are disposed in the element region. A distance from the first electrode to the third electrode is less than a distance from the first electrode to the fourth electrode.

10 Claims, 12 Drawing Sheets

(51) Int. Cl.
*H01L 29/423* (2006.01)
*H01L 27/088* (2006.01)
*H01L 29/739* (2006.01)
*H01L 29/10* (2006.01)

SEMICONDUCTOR DEVICE WITH VARIED ELECTRODES

CROSS-REFERENCE TO RELATED APPLICATION

This application is based upon and claims the benefit of priority from Japanese Patent Application No. 2015-019163, filed Feb. 3, 2015, the entire contents of which are incorporated herein by reference.

FIELD

Embodiments described herein relate generally to a semiconductor device.

BACKGROUND

In a semiconductor device such as an insulated gate bipolar transistor (IGBT) or the like, an element region where transistors are disposed may be surrounded by a terminal end region and a local breakdown may occur in the element region in the vicinity of the terminal end region. This may occur, for example, because a spot where avalanche breakdown easily occurs (a so-called hot spot) may be generated between the element region and the terminal end region. There is a phenomenon in which a hot spot moves between the element region and the terminal end region several times, when a charge such as a surge is applied to the element region, for example. When a hot spot moves between the element region and the terminal end region, a breakdown voltage of the element region may eventually exceed a critical breakdown voltage, and this causes local breakdown in the element region. A semiconductor device which prevents such local breakdown and has a high breakdown voltage would be desirable.

DETAILED DESCRIPTION

Figure 1A:
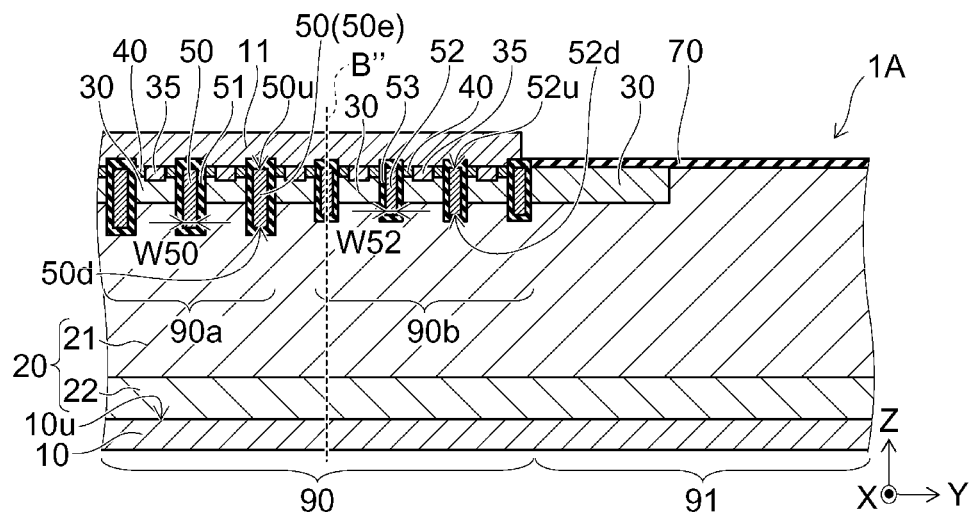
FIG. 1A is a cross-sectional view schematically depicting a semiconductor device according to a first embodiment at a position along line A-A' of FIG. 1C.

Embodiments provide a semiconductor device having a higher breakdown voltage.

In general, according to one embodiment, a semiconductor device comprises an element region and a terminal region. The terminal region surrounds the element region in a first plane. The semiconductor device includes a first semiconductor region having a first conductivity type, a second semiconductor region having a second conductivity type on the first semiconductor region, and a third semiconductor region having the first conductivity type on the second semiconductor region. A first electrode is electrically connected to the first semiconductor region. A second electrode is electrically connected to the third semiconductor region. A third electrode is disposed in the element region to be adjacent to the first semiconductor region, the second semiconductor region, and the third semiconductor region via a first insulating film. A fourth electrode is disposed in the element region between the third electrode and the terminal region along a first direction parallel to the first plane. The fourth electrode is adjacent to the first semiconductor region, the second semiconductor region, and the third semiconductor region via a second insulating film. A first distance along a second direction crossing the first plane from the first electrode to the third electrode is less than a second distance along the second direction from the first electrode to the fourth electrode.

In general, according to another embodiment, a semiconductor device includes: an element region and a terminal end region surrounding the element region; a first semiconductor region having a first conductivity type; a second semiconductor region having a second conductivity type that is provided on the first semiconductor region; a third semiconductor region having a first conductivity type that is provided on the second semiconductor region; a first electrode that is electrically connected to the first semiconductor region; a second electrode that is electrically connected to the third semiconductor region; a third electrode that is provided in the element region and faces the first semiconductor region, the second semiconductor region, and the third semiconductor region through a first insulating film; and a fourth electrode that is provided in the element region, is provided to be closer to the terminal end region with respect to the third electrode, faces the first semiconductor region, the second semiconductor region, and the third semiconductor region through a second insulating film, and has a first distance between a lower end and the first electrode which is longer than a second distance between a lower end of the third electrode and the first electrode.

Hereinafter, exemplary embodiments will be described with reference to the drawings. In the following description, the same reference numerals are used for the same (or substantially similar) elements and description of an element which is described once may be omitted from subsequent explanations. In the exemplary embodiments, unless otherwise noted, n type (first conductivity type) impurity concentration is shown in decreasing relative order as $n^+$ type, n type, and $n^-$ type. And p type (second conductivity type) impurity concentration is shown in decreasing relative order as $p^+$ type, p type, and $p^-$ type. In addition, three-dimensional coordinates (X axis, Y axis, and Z axis) are introduced in the drawings described below.

(First Embodiment)

Figure 1B:
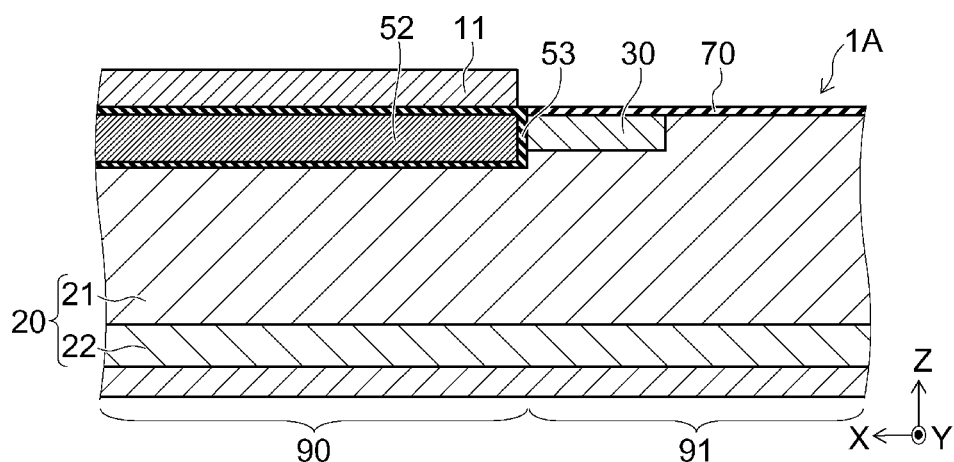
FIG. 1B is a cross-sectional view schematically depicting the semiconductor device according to the first embodiment at a position along line B-B' of FIG. 1C.
Figure 1C:
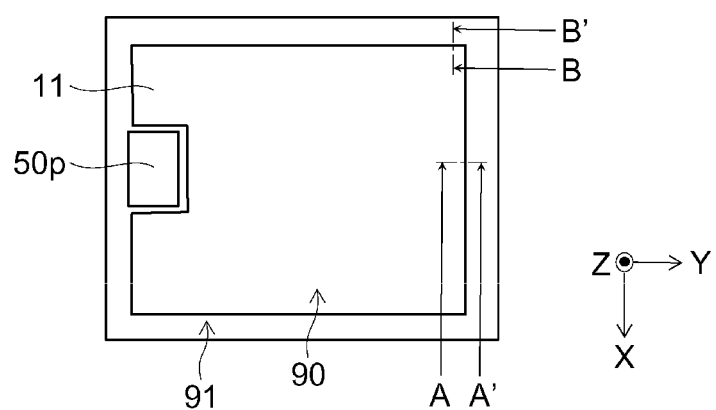
FIG. 1C is a plan view schematically depicting the semiconductor device according to the first embodiment.

FIG. 1A is a cross-sectional view schematically showing main parts of a semiconductor device according to a first embodiment, and is a schematic cross-sectional view seen at a position along line A-A' of FIG. 1C. FIG. 1B is a cross-sectional view schematically showing main parts of the semiconductor device according to the first embodiment, and is a schematic cross-sectional view seen at a position along line B-B' of FIG. 1C. FIG. 1C is a plan view schematically showing the semiconductor device according to the first embodiment. FIG. 1B also corresponds to a schematic cross-sectional view seen at a position along broken line B" of FIG. 1A. FIG. 1A shows a cross section in a Y-Z plane of a semiconductor device 1A according to the first embodiment, and FIG. 1B shows a cross section in an X-Z plane of the semiconductor device 1A.

The semiconductor device 1A is a metal oxide semiconductor field effect transistor (MOSFET) having an upper and lower electrode structure. The semiconductor device 1A, for example, includes an element region 90 where elements (for example, transistors) are arranged and a terminal end region (terminal region) 91 surrounding the element region 90 on the outer side of the element region 90. Herein, the transistors are, for example, the MOSFET and include a source region, a drain region, a base region, a gate electrode, and a gate insulating film. The element region 90 is also sometimes referred to as an active region 90.

The semiconductor device 1A, for example, includes a first semiconductor region (hereinafter, for example, a semiconductor region 20), a second semiconductor region (hereinafter, for example, a base region 30), a third semiconductor region (hereinafter, for example, a source region 40), a first electrode (hereinafter, for example, a drain region 10), a second electrode (hereinafter, for example, a source electrode 11), a plurality of third electrodes (hereinafter, for example, gate electrodes 50), a plurality of fourth electrodes (hereinafter, for example, gate electrodes 52), and a contact region 35.

Herein, a direction from the drain electrode 10 to the source electrode 11 is, for example, set as a Z direction, a direction intersecting with the Z direction is, for example, set as an X direction, and a direction intersecting with the Z direction and the X direction is, for example, set as a Y direction. In the first embodiment, a direction in which the gate electrodes 50 are adjacently arranged is, for example, set as the Y direction.

The semiconductor region 20 includes an n type drift region 21 and an $n^+$ type drain region 22. The drift region 21 is provided on the drain region 22. The impurity concentration of the drain region 22 is higher than the impurity concentration of the drift region 21. The drift region 21 is, for example, an epitaxial growth layer.

The drain electrode 10 is provided under the drain region 22. The drain electrode 10 comes in contact with the drain region 22 of the semiconductor region 20. The drain electrode 10 is electrically connected to the drain region 22.

The base region 30 is provided on the semiconductor region 20. The base region 30 is selectively provided on the surface of the drift region 21—that is, the base region 30 does not completely cover the surface of the drift region 21. The conductivity type of the base region 30 is p type. The base region 30 is provided in an element region 90 and a part of a terminal end region 91. In the terminal end region 91, an interlayer insulating film 70 is provided on the base region 30 and the semiconductor region 20.

The source region 40 is provided on the base region 30. The source region 40 is selectively provided on the surface of the base region 30—that is, the source region 40 does not completely cover the surface of the base region 30. The conductivity type of the source region 40 is $n^+$ type. The impurity concentration of the source region 40 is higher than the impurity concentration of the drift region 21.

The source electrode 11 is provided on the source region 40. The source electrode 11 comes in contact with the source region 40. The source electrode 11 is electrically connected to the source region 40.

The contact region 35 is selectively provided on the surface of the base region 30—that is, the contact region 35 does not completely cover the surface of the base region 30. The contact region 35 contacts the source electrode 11 and the source region 40. The conductivity type of the contact region 35 is $p^+$ type. The impurity concentration of the contact region 35 is higher than the impurity concentration of the base region 30.

In the semiconductor device 1A, a plurality of gate electrodes 50 are provided in the drift region 21 of the semiconductor region 20, the base region 30, and the source region 40 so as to face each other through first insulating films (hereinafter, for example, insulating films 51). The insulating films 51 which come in contact with the gate electrodes 50 are also referred to as gate insulating films. The plurality of gate electrodes 50 are electrically connected to a gate pad 50p (see FIG. 1C).

In the semiconductor device 1A, the plurality of gate electrodes 50 are provided in the element region 90. The plurality of gate electrodes 50 are, for example, arranged in the Y direction. Each of the gate electrodes 50 extends in the X direction substantially in parallel. An upper end 50u of the gate electrode 50 is positioned on the upper side of the base region 30 and a lower end 50d of the gate electrode 50 is positioned inside of the drift region 21. That is, the gate electrode 50 has a trench structure. A distance between the lower end 50d of each gate electrode 50 and an upper surface 10u of the drain electrode 10 is substantially the same as each other.

In the semiconductor device 1A, the plurality of gate electrodes 52 are provided in the element region 90. The gate electrodes 52 are provided on the side of the terminal end region 91 with respect to the gate electrodes 50. That is, along the Y-direction, the plurality of gate electrodes 52 is between the plurality of gate electrodes 50 and the terminal end region 91. The plurality of gate electrodes 52 are provided on the outer side of a gate electrode 50e which is an outermost (along the Y-direction) gate electrode 50 in the plurality of gate electrodes 50. The plurality of gate electrodes 52 are arranged in the element region 90 but adjacent or proximate to the terminal end region 91. The plurality of gate electrodes 52 are provided in the drift region 21 of the semiconductor region 20, the base region 30, and the source region 40 so as to face each other through second insulating films (hereinafter, for example, insulating films 53). The insulating films 53 which come in contact with the gate electrodes 52 are also referred to as gate insulating films. The plurality of gate electrodes 52 are electrically connected to the gate pad 50$p$.

The plurality of gate electrodes 52 are, for example, arranged in the Y direction. Each of the gate electrodes 52 extends in the X direction substantially in parallel. An upper end 52$u$ of the gate electrode 52 is positioned on the upper side of the base region 30 and a lower end 52$d$ of the gate electrode 52 is positioned inside of the drift region 21. That is, the gate electrode 52 has a trench structure. A distance (first distance) between the lower end 52$d$ of each gate electrode 52 and the upper surface 10$u$ of the drain electrode 10 is substantially the same as each other.

Herein, the distance between the lower end 52$d$ of each gate electrode 52 and the upper surface 10$u$ of the drain electrode 10 is longer than a distance (second distance) between the lower end 50$d$ of each gate electrode 50 and the upper surface 10$u$ of the drain electrode 10. That is, the lowermost depth of trench gate electrodes 50 along the Z-direction is greater than the lowermost depth of trench gate electrodes 52 along the Z-direction. In addition, in the Y direction, a width W52 of each gate electrode 52 is less than a width W50 of each gate electrode 50.

That is, the lower end 52$d$ of the gate electrode 52 provided in an element region 90$b$ which is adjacent to the terminal end region 91 is positioned closer, in the Z-direction, to the source electrode 11 than is the lower end 50$d$ of the gate electrode 50 provided in an element region 90$a$. The width W52 of the gate electrode 52 is less than the width W50 of the gate electrode 50.

Although the number of the gate electrodes 52 depicted in FIG. 1A is three, this number is not particularly limited to three and may also be greater than three or less than three.

A main component of each semiconductor region provided between the drain electrode 10 and the source electrode 11 is, for example, silicon (Si). The main component of each semiconductor region may also be silicon carbide (SiC), gallium nitride (GaN) or the like. When the main component of each semiconductor region is silicon (Si), phosphorus (P), arsenic (As), and the like are used as an n type impurity element and boron (B) and the like are used as a p type impurity element. In the semiconductor device according to the first embodiment, the same effects are obtained, even when the conductivity types of p type and n type are replaced with each other.

The material of the drain electrode 10 and the material of the source electrode 11 are, for example, metal including at least one metal selected from a group comprising aluminum (Al), titanium (Ti), nickel (Ni), tungsten (W), and gold (Au). The materials of the gate electrodes 50 and 52, for example, include polysilicon, tungsten (W), and the like. The material of the insulting film may include silicon oxide and silicon nitride.

A manufacturing process of the semiconductor device 1A will be described.

FIGS. 2A to 4B are cross-sectional views schematically showing a manufacturing process of the main parts of the semiconductor device according to the first embodiment.

Figure 2A:
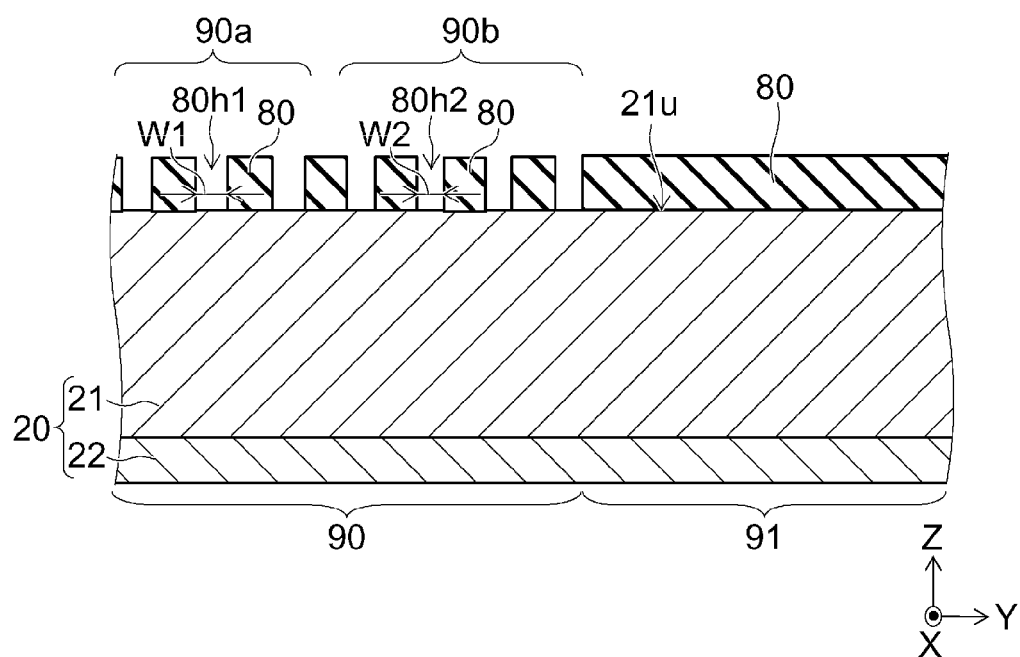
FIGS. 2A and 2B are cross-sectional views schematically showing a manufacturing process of the semiconductor device according to the first embodiment.

For example, as shown in FIG. 2A, a mask layer 80 is formed on the semiconductor region 20. Herein, openings 80$h$1 and 80$h$2 are provided in the mask layer 80. The openings 80$h$1 and 80$h$2 are formed in the element region 90. An upper surface 21$u$ of the drift region 21 is exposed by each of the openings 80$h$1 and 80$h$2.

Herein, a width W2 of the opening 80$h$2 provided in the element region 90$b$ is smaller than a width W1 of the opening 80$h$1 provided in the element region 90$a$.

Figure 2B:
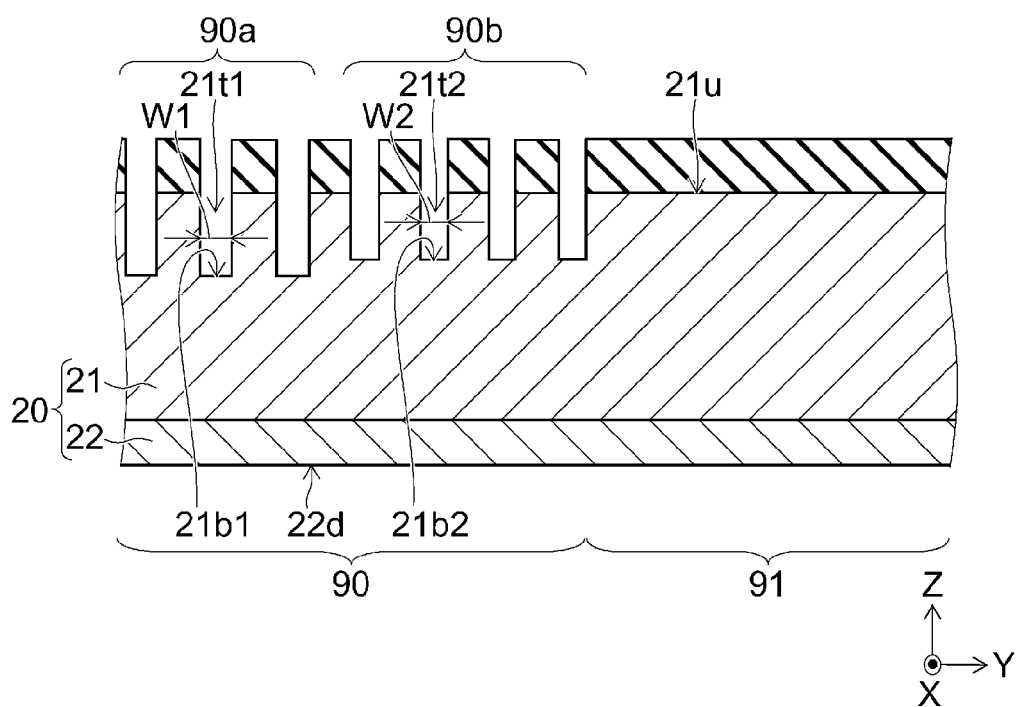

Next, as shown in FIG. 2B, an etching process is performed in the drift region 21 left exposed by the mask layer 80. The etching is, for example, reactive ion etching (RIE). Accordingly, trenches 21$t$1 and 21$t$2 are formed in the drift region 21.

Herein, widths of the openings 80$h$1 and 80$h$2 of the mask layer 80 match the widths of the trenches formed in the drift region 21. That is, the width W2 of the trench 21$t$2 provided in the element region 90$b$ is smaller than the width W1 of the trench 21$t$1 provided in the element region 90$a$.

A depth of the trench 21$t$2 having a small width is less than a depth of the trench 21$t$1 having a large width, due to a loading effect. That is, a distance between a bottom portion 21$b$2 of each trench 21$t$2 and a lower surface 22$d$ of the drain region 22 is greater than a distance between a bottom portion 21$b$1 of each trench 21$t$1 and the lower surface 22$d$ of the drain region 22.

Figure 3A:
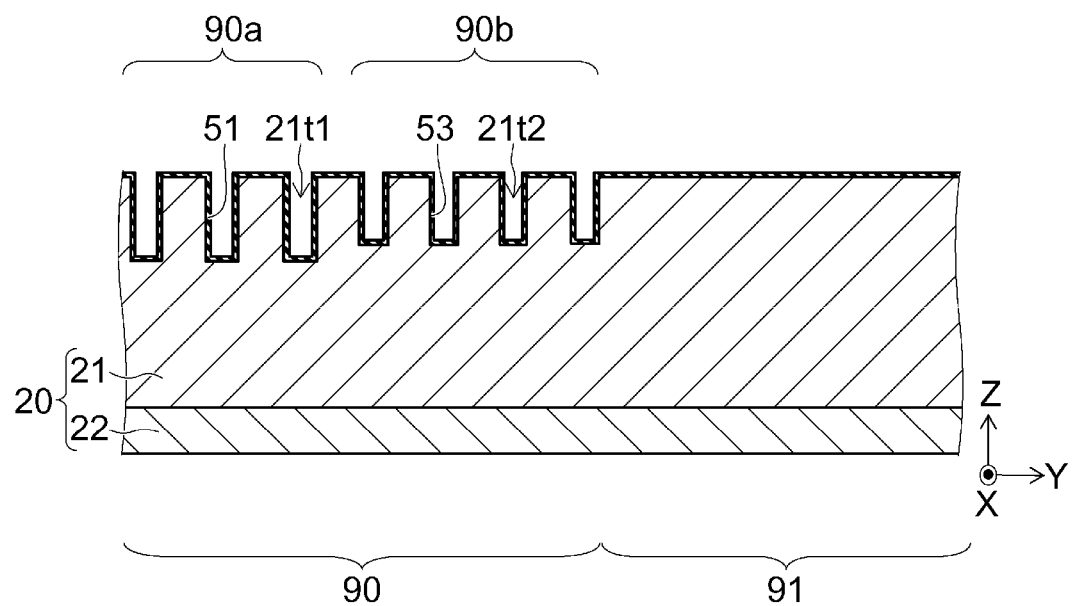
FIGS. 3A and 3B are cross-sectional views schematically showing a manufacturing process of the semiconductor device according to the first embodiment.

Next, as shown in FIG. 3A, the insulating film 51 is conformally formed on an inner wall of the trench 21$t$1 and the insulating film 53 is conformally formed on an inner wall of the trench 21$t$2. The insulating films 51 and 53 are, for example, formed by a thermal oxidation method and/or chemical vapor deposition (CVD).

Figure 3B:
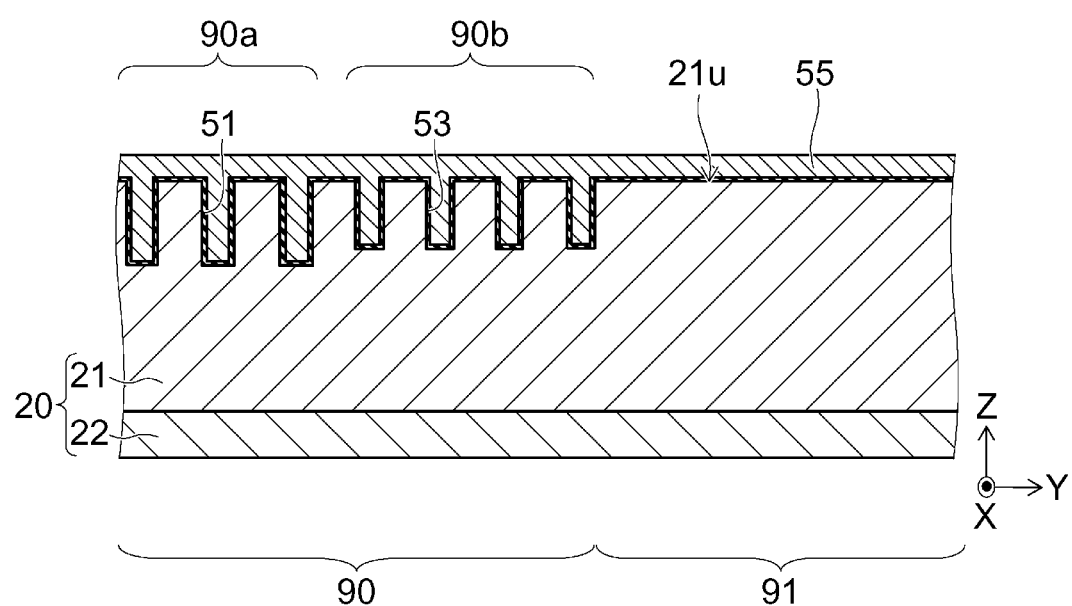

Next, as shown in FIG. 3B, a conductive layer 55 is formed in the trench 21$t$1 on the insulating film 51 and the conductive layer 55 is formed in the trench 21$t$2 on the insulating film 53. The conductive layer 55 is also provided on the upper surface 21$u$ of the drift region 21. The conductive layer 55 is, for example, formed by CVD.

Subsequently, the insulating film provided on the upper surface 21$u$ of the drift region 21 and the conductive layer 55 are, for example, removed by chemical mechanical polishing (CMP). Accordingly, the conductive layer 55 is divided into the gate electrodes 50 and the gate electrodes 52. This state is shown in FIG. 4A.

Figure 4A:
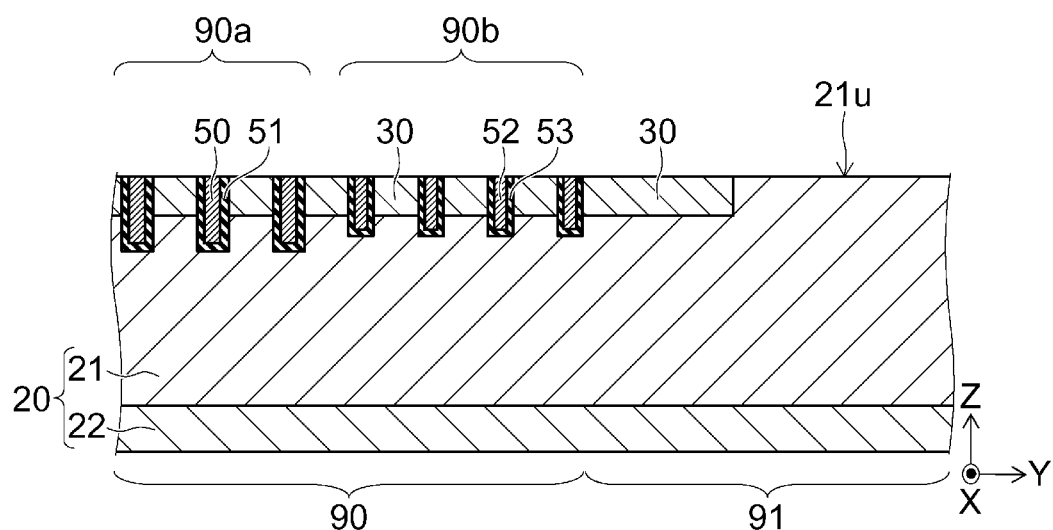
FIGS. 4A and 4B are cross-sectional views schematically showing a manufacturing process of the semiconductor device according to the first embodiment.

As shown in FIG. 4A, a p type impurity element is selectively injected to the side of the upper surface 21$u$ of the drift region 21 and the base region 30 is formed on the side of the upper surface 21$u$ of the drift region 21.

Figure 4B:
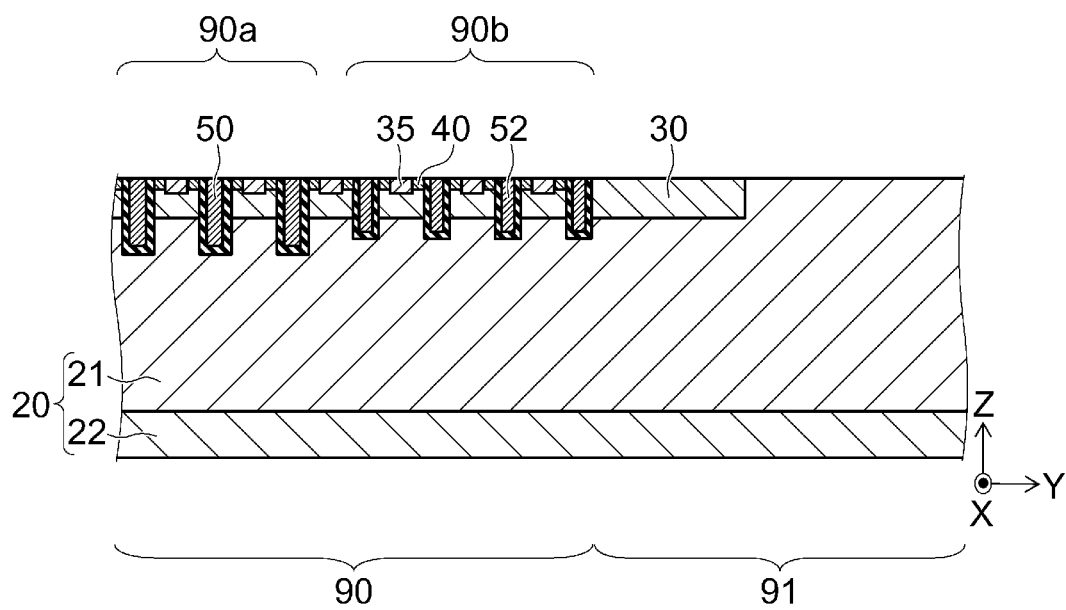

Next, as shown in FIG. 4B, an n type impurity element is selectively injected to the side of the upper surface of the base region 30 and the source region 40 is formed on the side of the upper surface of the base region 30. Subsequently, the p type impurity element is selectively injected to the side of the upper surface of the source region 40 and the contact region 35 is formed on the side of the upper surface of the source region 40. In order to activate the injected impurity elements, a heating process is performed for the base region 30, the source region 40, and the contact region 35.

After that, as shown in FIG. 1A, each upper end of the gate electrodes 50 and 52 is covered with the insulating films and the interlayer insulating film 70 is formed on the base region 30 and the drift region 21 of the terminal end region 91. The drain electrode 10 and the source electrode 11 are also subsequently formed as depicted in FIG. 1A.

An operation of the semiconductor device 1A will be described. The element region 90 and a region where the source electrode 11 is arranged do not have to completely coincide. However, for the first embodiment, the operation of the semiconductor device 1A will be described by assuming that the element region 90 and a region where the source electrode 11 do in fact substantially coincide with each other.

Before describing the operation of the semiconductor device 1A, an operation of a semiconductor device 100 according to a reference example will be described.

Figure 5A:
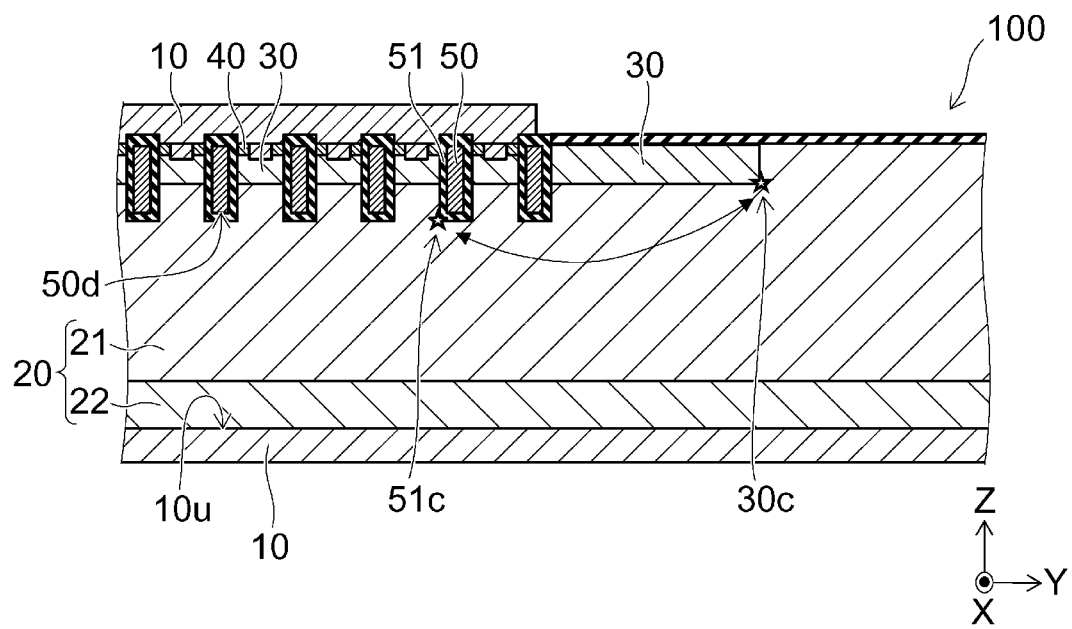
FIG. 5A is a cross-sectional view schematically depicting a semiconductor device according to a reference example.
Figure 5B:
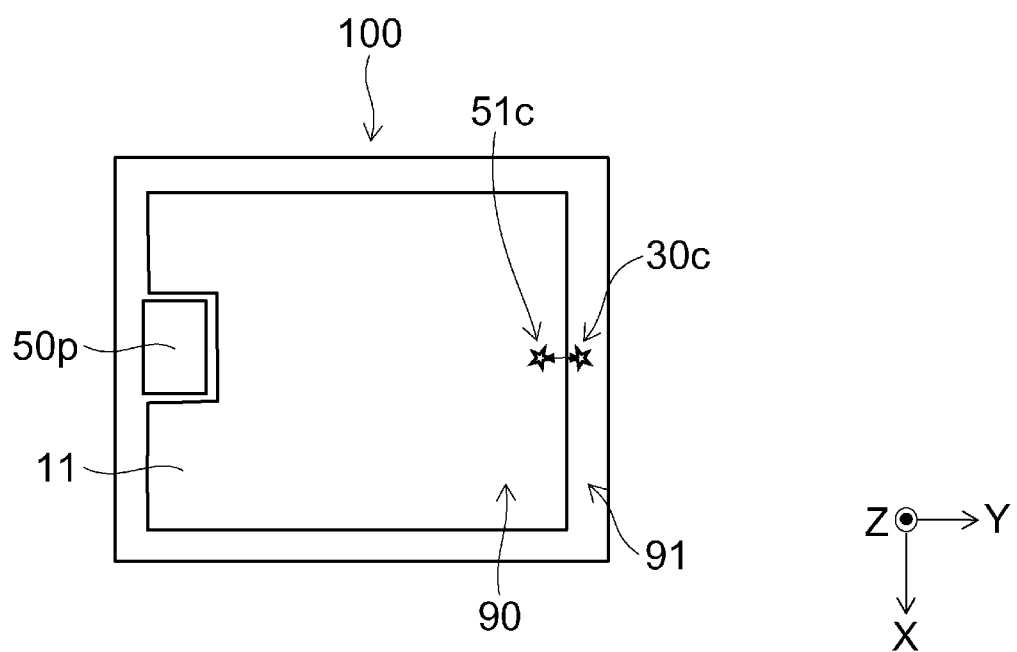
FIG. 5B is a plan view schematically depicting the semiconductor device according to the reference example.

FIG. 5A is a cross-sectional view schematically showing main parts of the semiconductor device according to the reference example, and FIG. 5B is a plan view schematically showing the semiconductor device according to the reference example.

FIG. 5A shows a cross section in the Y-Z plane of the semiconductor device 100 according to the reference example. In the semiconductor device 100, the gate electrodes 52 are not provided and only the plurality of gate electrodes 50 is provided as gates. In the semiconductor device 100, all of distances between the lower end 50d of each gate electrode 50 and the upper surface 10u of the drain electrode 10 are the same.

In the semiconductor device 100, a high potential is applied to the drain electrode 10 as compared to the source electrode 11, in an on and off state.

When a potential equal to or higher than a threshold potential (Vth) is applied to the gate electrodes 50, a channel (inversion layer) is formed in the base region 30 along the insulating films 51 which are gate insulating films, and electronic current flows through the source region 40, the channel, the drift region 21, and the drain region 22. That is, the semiconductor device 100 is in the on state (conducting state).

When a potential less than the threshold potential (Vth) is applied to the gate electrodes 50, a channel is not formed in the base region 30 along the insulating films 51 and the electronic current described above does not flow. That is, the semiconductor device 100 is in the off state (non-conducting state).

Herein, when a surge voltage is applied between the source and the drain in the off state, an electric field is concentrated near a corner 51c of the insulating film 51. Avalanche breakdown thus may occur in the drift region 21 near the corner 51c due to the concentration of the electric field. A location where the avalanche breakdown occurs is referred to as a hot spot. FIGS. 5A and 5B schematically show locations of hot spots with stars (see near corner 51c and corner 30c).

In the off state, the electric field is also concentrated on the vicinity of a corner 30c of the base region 30 in the terminal end region 91. Accordingly, a hot spot may also be generated at a pn junction (between p type base region 30/n type drift region 21) in the terminal end region 91 due to the concentrated electric field.

Herein, resistance to the avalanche breakdown is dependent on the degree of a depletion layer spreading in the drift region 21. That is, as the depletion layer extends, the resistance increases. In addition, the degree of extension of the depletion layer is also dependent on a temperature of the drift region 21. Specifically, as the temperature of the drift region 21 increases, the depletion layer more easily extends.

The hot spot may be preferentially generated in the element region 90 through which the electronic current flows in the initial stage of the operation of the semiconductor device 100 (e.g., before device operation has increased device temperature). However, the temperature of the drift region 21 in the element region 90 will typically increase due to current flow in the element region 90. Accordingly, the resistance properties of the drift region 21 in the element region 90 are relatively improved during device operation (due to increased drift region temperature). Therefore, the hot spot is more easily generated in the terminal end region 91 now having relatively low resistance properties, as compared to the element region 90.

Meanwhile, in the terminal end region 91, when generation of the hot spot is shifted, the temperature of the drift region in the terminal end region 91 begins to increase. Accordingly, the resistance properties of the drift region 21 in the terminal end region 91 are relatively improved with the increase in temperature. That is, the hot spot is again more easily generated in the element region 90, as compared to the terminal end region 91.

That is, a phenomenon in which the hot spot location shifts between the element region 90 and the terminal end region 91 occurs (see arrows of FIGS. 5A and 5B).

The semiconductor device 100 of this reference example has a structure in which all of the distances between the lower end 50d of each gate electrode 50 and the upper surface 10u of the drain electrode 10 are the same as each other. Accordingly, it is considered that the hot spot is generated in the vicinity of the corner 51c of an arbitrary insulating film 51 in the initial stage of the generation.

However, a distance between a gate electrode 50 nearest the terminal end region 91 and the pn junction of the terminal end region 91 is shorter than a distance between a gate electrode 50 positioned in the center of the element region and the pn junction of the terminal end region 91. Accordingly, the repeated movement of the hot spot is most easily performed between the corner 51c of the insulating film 51 nearest the terminal end region 91 and the pn junction of the terminal end region 91. That is, the breakdown current locally flows between the vicinity of the terminal end region 91 and the terminal end region 91. When the repeated movement of the hot spot is continued between these same locations, the drift region 21 may eventually be deteriorated to a degree exceeding a critical breakdown voltage of the drift region 21 between the above-mentioned locations, and element breakdown may occur.

In order to prevent the element breakdown, there is a method of relatively increasing a thickness of the drift region 21 in the element region 90 near the terminal end region 91. According to this method, as the thickness of the drift region 21 in element region 90 may be relatively increased near the terminal end region 91, such that the extension of the depletion layer in this portion (of drift region 21 in element region 90 near the terminal end region 91) is promoted and the resistance properties of this portion is preferentially improved.

However, when the drift region 21 is an epitaxial growth layer, as is typically the case, adopting this method requires selectively increasing the film thickness of an epitaxial growth layer in only a specific region of the layer. Accordingly, the manufacturing becomes complicated.

There is also a method of providing a field plate electrode to alleviate the electric concentration at the vicinity of the corner 51c of the insulating film 51 or the vicinity of the corner 30c of the base region 30. The field plate electrode is, for example, provided on the drift region 21 in the element region 90 near the terminal end region 91 or the pn junction of the terminal end region 91. However, this method requires a large number of manufacturing steps and the manufacturing also becomes complicated.

Figure 6A:
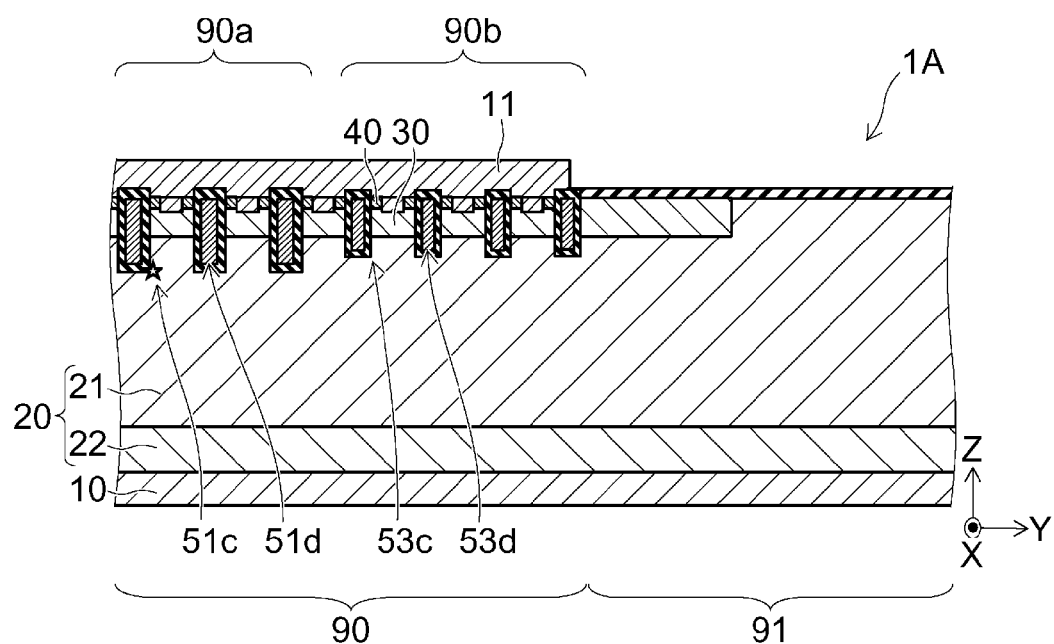
FIG. 6A is a cross-sectional view schematically depicting the semiconductor device according to the first embodiment.
Figure 6B:
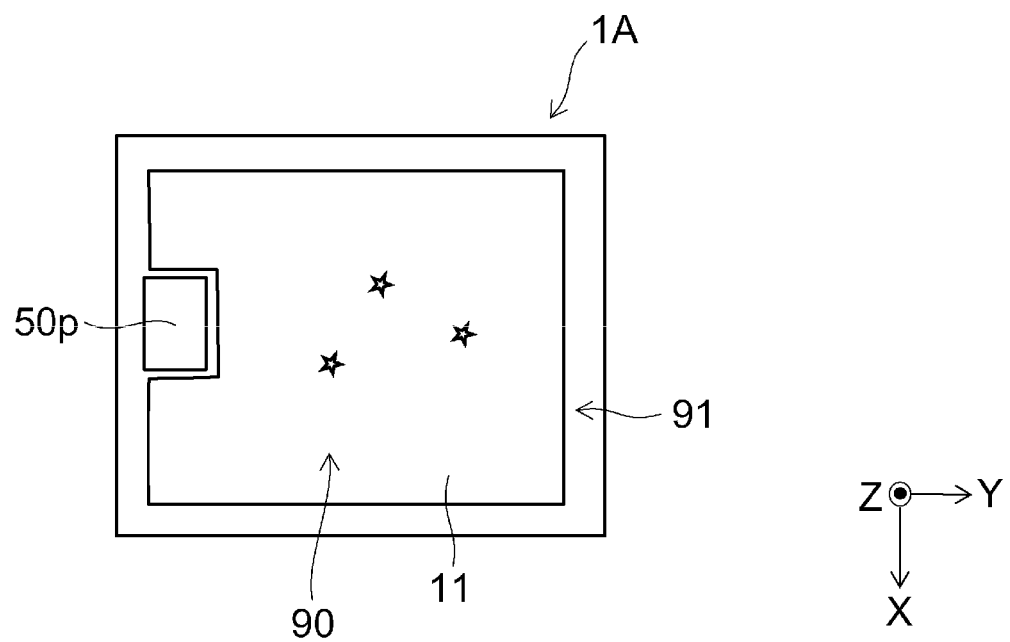
FIG. 6B is a plan view schematically depicting the semiconductor device according to the first embodiment.

FIG. 6A is a cross-sectional view schematically showing main parts of the semiconductor device according to the first embodiment, and FIG. 6B is a plan view schematically showing main parts of the semiconductor device according to the first embodiment.

In this first embodiment, the hot spot is also preferentially generated in the element region 90 of the semiconductor device 1A during the initial stage of the operation of the semiconductor device 1A. However, the temperature of the drift region 21 in the element region 90 relatively increases due to breakdown current of the element region 90. Accordingly, the resistance properties of the drift region 21 in the element region 90 are relatively improved. Therefore, the hot spot is eventually more easily generated in the terminal end region 91 having relatively low resistance properties, as compared to the element region 90 (having an elevated temperature due to operation).

Eventually, the temperature of the drift region 21 in the terminal end region 91 relatively increases. Accordingly, the resistance properties of the drift region 21 in the terminal end region 91 are relatively improved. That is, the hot spot is again more easily generated in the element region 90, as compared to the terminal end region 91 (having an elevated temperature). Therefore, it is considered that the repeated movement of the hot spot also occurs between the element region 90b which is in the vicinity of the terminal end region 91 and the terminal end region 91, in the semiconductor device 1A, as described in the reference example.

However, in the semiconductor device 1A, the plurality of gate electrodes 52 are included on the outer side of the plurality of gate electrodes 50. Herein, the lower end 52d of the gate electrode 52 is positioned to be closer to the source electrode 11 with respect to the lower end 50d of the gate electrode 50. That is, the lower end 52d of the gate electrode 52 is separated from the drain electrode 10 more than the lower end 50d of the gate electrode 50. Therefore, in the semiconductor device 1A, the breakdown voltage of the drift region 21 in the element region 90b is relatively improved due to its relatively greater thickness.

Accordingly, an electric field concentrated on the corner 53c of the insulating film 53 is alleviated compared to an electric field concentrated on the corner 51c of the insulating film 51.

Herein, the distance between the gate electrode 50 and the pn junction of the terminal end region 91 is longer than the distance between the gate electrode 52 and the pn junction of the terminal end region 91. Accordingly, the hot spot hardly moves between the element region 90a and the terminal end region 91.

That is, according to the semiconductor device 1A, a phenomenon of the repeated movement of the hot spot is prevented and the breakdown of the drift region 21 hardly occurs. That is, the breakdown voltage of the semiconductor device 1A is improved compared to the breakdown voltage of the semiconductor device 100.

According to the semiconductor device 1A, the breakdown voltage of the drift region 21 in the element region 90b is relatively improved. Accordingly, it is not necessary to increase the thickness of the drift region 21 in the element region 90b by other methods. In addition, it is not necessary to provide the field plate electrode dedicated to alleviating the electric concentration in the vicinity of the corner 51c of the insulating film 51 or the vicinity of the corner 30c of the base region 30. Therefore, according to the semiconductor device 1A, lower manufacturing cost is realized. In addition, according to the semiconductor device 1A, the gate electrodes 52 provided in the element region 90b function as a control electrode which controls the electric connection (conduction state). Therefore, in the on state, the on-resistance of the semiconductor device 1A does not decrease and large current is ensured.

Modification Example Of First Embodiment

Figure 7:
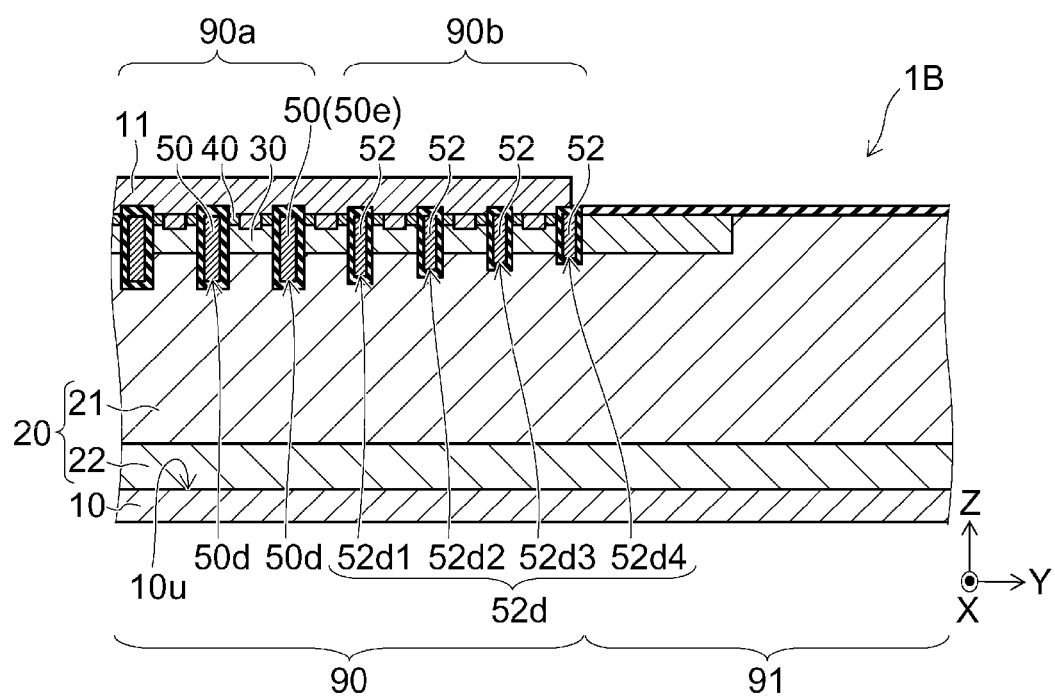
FIG. 7 is a cross-sectional view schematically depicting a semiconductor device according to a modification example of the first embodiment.

FIG. 7 is a cross-sectional view schematically showing main parts of a semiconductor device according to a modification example of the first embodiment.

In a semiconductor device 1B, a distance between the lower end 52d of each gate electrode 52 and the drain electrode 10 increases from the element region 90 towards the terminal end region 91. For example, the distance between the lower end 52d of the gate electrode 52 and the drain electrode 10 increases as the particular gate electrode 52 gets closer to the terminal end region 91. For example, the distance between each of lower ends 52d1 to 52d4 of the gate electrodes 52 and the drain electrode 10 increases from 52d1 to 52d4.

In the semiconductor device 1B, the distance between the lower end 52d of each gate electrode 52 and the upper surface 10u of the drain electrode 10 is longer than the distance between the lower end 50d of each gate electrode 50 and the upper surface 10u of the drain electrode 10. Accordingly, the breakdown voltage of the semiconductor device 1B is improved, compared to the breakdown voltage of the semiconductor device 100.

In the semiconductor device 1B, a difference in height between the lower end 50d of the gate electrode 50e which is arranged on the outermost side among the plurality of gate electrodes 50 and the lower end 52d1 of the gate electrode 52 adjacent to the gate electrode 50e is small, as compared to a case of the semiconductor device 1A (see FIG. 1A).

Accordingly, the electric concentration in the vicinity of the lower end 50d of the gate electrode 50e which is on outermost side among the plurality of gate electrodes 50 is alleviated, as compared to the case of the semiconductor device 1A. That is, the breakdown voltage of the semiconductor device 1B is further improved, as compared to the breakdown voltage of the semiconductor device 1A.

(Second Embodiment)

Figure 8A:
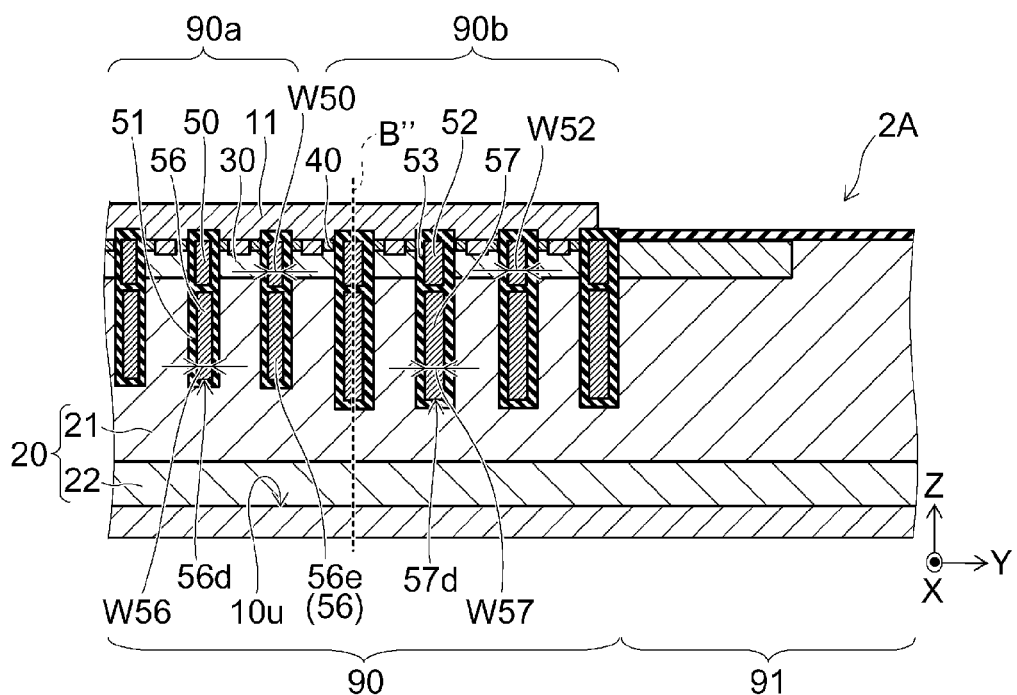
FIG. 8A is a cross-sectional view schematically depicting a semiconductor device according to a second embodiment.
Figure 8B:
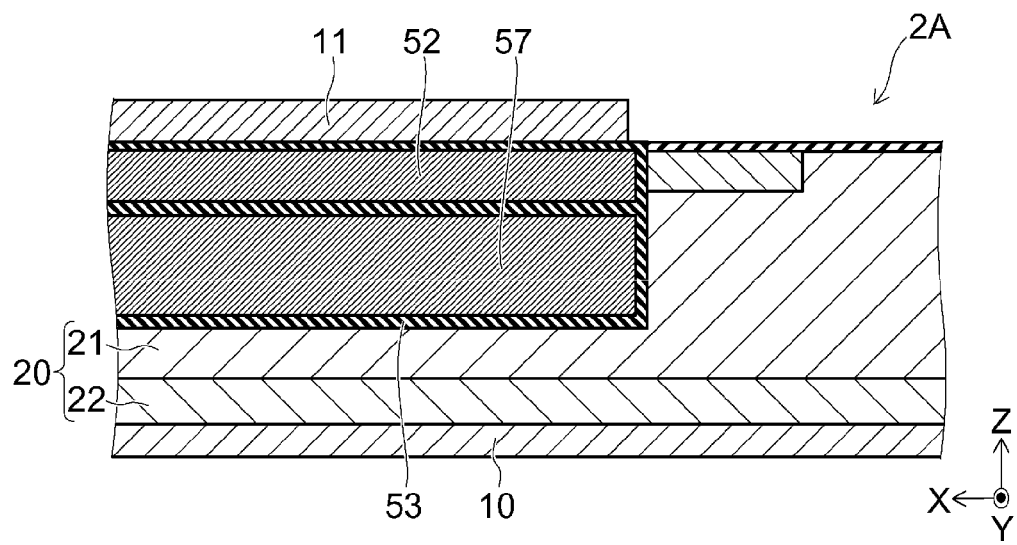
FIG. 8B is a cross-sectional view schematically depicting the semiconductor device according to the second embodiment.

FIG. 8A is a cross-sectional view schematically showing main parts of a semiconductor device according to a second embodiment, and FIG. 8B is a cross-sectional view schematically showing main parts of the semiconductor device according to the second embodiment. FIG. 8B corresponds to a schematic cross-sectional view seen at a position along broken line B" of FIG. 8A.

A semiconductor device 2A, according to the second embodiment, includes the semiconductor region 20, the base region 30, the source region 40, the drain electrode 10, the source electrode 11, the plurality of gate electrodes 50, the plurality of gate electrodes 52, and the contact region 35. The semiconductor device 2A, further includes a plurality of fifth electrodes (hereinafter, for example, field plate electrodes 56) and a plurality of sixth electrodes (hereinafter, for example, field plate electrodes 57). The materials of the field plate electrodes 56 and 57 are the same as the materials of the gate electrodes 50 and 52, for example.

In the semiconductor device 2A, the field plate electrodes 56 are provided on the lower side of the gate electrodes 50. The field plate electrodes 56 are provided so as to face the drift region 21 and the plurality of gate electrodes 50 through the insulating films 51. Each of the plurality of field plate electrodes 56 is electrically connected to the source electrode 11. The insulating film 51 coming in contact with the field plate electrode 56 may be referred to as a field plate insulating film.

The field plate electrodes 56 extend towards the drain electrode 10 from the side of the source electrode 11 and have a trench structure. The field plate electrodes 56 are, for example, periodically arranged in the Y direction. The gate electrodes 50 and the field plate electrodes 56 of the semiconductor device 2A are, for example, aligned in the Z direction. The field plate electrodes 56 extend substantially in parallel to the gate electrodes 50 in the X direction.

In the semiconductor device 2A, the field plate electrodes 57 are provided on the lower side of the gate electrodes 52. Each of the plurality of field plate electrodes 57 is provided so as to face the drift region 21 and the plurality of gate electrodes 52 through the insulating film 53. The plurality of field plate electrodes 57 are provided on the outer side of a field plate electrode 56e, which is outermost (along the Y-direction) field plate electrode 56 among the plurality of the field plate electrodes 56. Each of the plurality of field plate electrodes 57 is electrically connected to the source electrode 11. The insulating film. 53 coming in contact with the field plate electrode 57 may be referred to as a field plate insulating film.

The field plate electrodes 57 extend towards the drain electrode 10 from the side of the source electrode 11 and have a trench structure. The field plate electrodes 57 are, for example, periodically arranged in the Y direction. The gate electrodes 52 and the field plate electrodes 57 of the semiconductor device 2A are, for example, aligned in the Z direction. The field plate electrodes 57 extend substantially in parallel to the gate electrodes 52 in the X direction.

In the semiconductor device 2A, a distance (third distance) between the lower end 57d of each field plate electrode 57 and the upper surface 10u of the drain electrode 10 is shorter than a distance (fourth distance) between the lower end 56d of each field plate electrode 56 and the upper surface 10u of the drain electrode 10.

In the semiconductor device 2A, the width W52, in the Y direction, of each gate electrode 52 is greater than the width W50, in the Y direction, of each gate electrode 50. In addition, a width W57, in the Y direction, of each field plate electrode 57 is greater than a width W56, in the Y direction, of each field plate electrode 56.

In the semiconductor device 2A, such field plate electrodes having different depths or widths can be formed using the loading effect present during etching of a plurality of trenches into the semiconductor substrate.

An operation of the semiconductor device 2A will be described.

In the semiconductor device 2A, the repeated movement of the hot spot also occurs between the element region 90b and the terminal end region 91.

However, in the semiconductor device 2A, the plurality of field plate electrodes 57 are included and the lower end 57d of the field plate electrode 57 is positioned to be closer to the drain electrode 10 than is the lower end 56d of the field plate electrode 56. That is, in the semiconductor device 2A, the depletion layer of the drift region 21 in the element region 90b easily extends, as compared to the depletion layer of the drift region 21 in the element region 90a.

Accordingly, in the semiconductor device 2A, the breakdown voltage of the drift region 21 in the element region 90b increases more than the breakdown voltage of the drift region 21 in the element region 90a.

Accordingly, avalanche breakdown easily occurs in the drift region 21 in the element region 90a as compared to the drift region 21 in the element region 90b. The distance between the gate electrode 50 and the pn junction of the terminal end region 91 is longer than the distance between the gate electrode 52 and the pn junction of the terminal end region 91. Accordingly, the semiconductor device 2A, the hot spot will rarely move between the element region 90a and the terminal end region 91.

As described above, in the semiconductor device 2A, a phenomenon of the repeated movement of the hot spot is also prevented and the breakdown of the drift region 21 rarely occurs. That is, the breakdown voltage of the semiconductor device 2A is improved compared to the breakdown voltage of the semiconductor device 100.

According to the semiconductor device 2A, the breakdown voltage of the drift region 21 in the element region 90 is relatively improved. Accordingly, it is not necessary to increase the thickness of the drift region 21 in the element region 90 in the vicinity of the terminal end region 91. Therefore, according to the semiconductor device 2A, the low cost is realized.

Modification Example Of Second Embodiment

Figure 9:
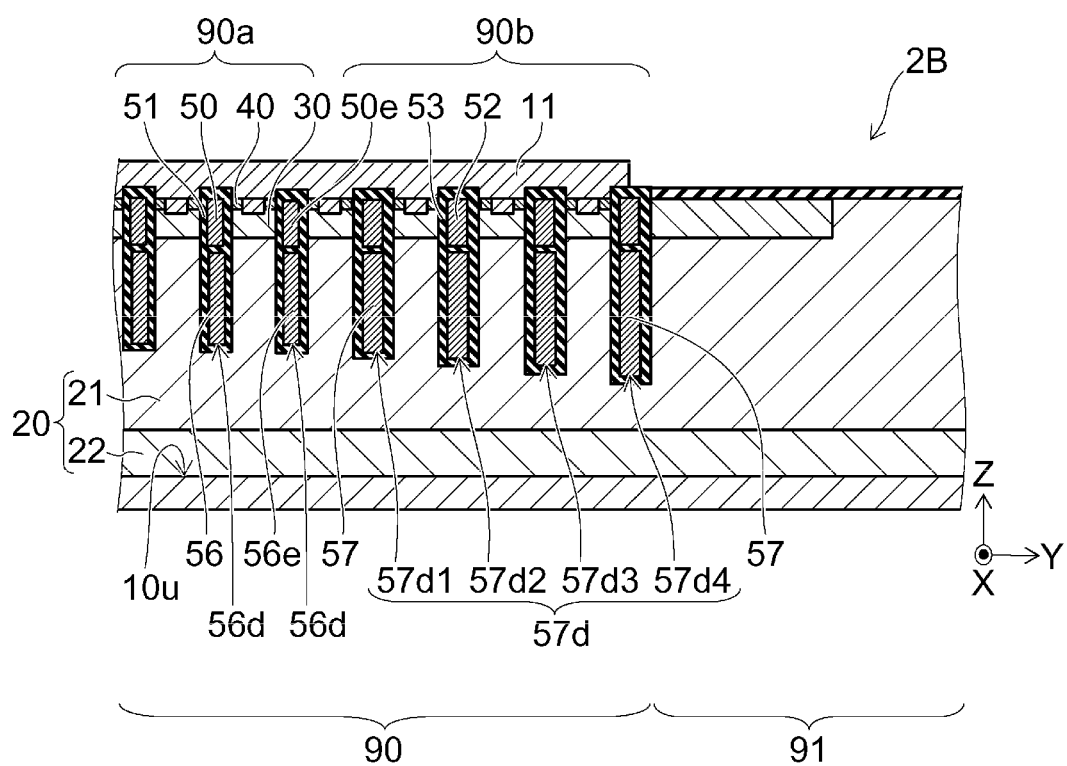
FIG. 9 is a cross-sectional view schematically depicting a semiconductor device according to a modification example of the second embodiment.

FIG. 9 is a cross-sectional view schematically showing main parts of a semiconductor device according to a modification example of the second embodiment.

In a semiconductor device 2B, the distance between the lower end 57d of each field plate electrode 57 and the upper surface 10u of the drain electrode 10 decreases from the element region 90 toward the terminal end region 91. For example, the distance between the lower end 57d of each successive field plate electrode 57 and the upper surface 10u of the drain electrode 10 decreases as each field plate electrode gets closer to terminal end region 91 (or alternatively, farther from the plurality of gate electrodes 50). For example, the distance between each of lower ends 57d1 to 57d4 of the field plate electrodes 57 and the drain electrode 10 decreases from lower end 57d1 to lower end 57d4.

In the semiconductor device 2B, the distance between the lower end 57d of each field plate electrode 57 and the upper surface 10u of the drain electrode 10 is shorter than the distance between the lower end 56d of each field plate electrode 56 and the upper surface 10u of the drain electrode 10. Accordingly, the breakdown voltage of the semiconductor device 2B is improved, compared to the breakdown voltage of the semiconductor device 100.

In the semiconductor device 2B, a difference in height between the lower end 56d of the field plate electrode 56e which is arranged on the outermost side among the plurality of field plate electrodes 56 and the lower end 57d1 of the field plate electrode 57 adjacent to the field plate electrode 56e is small compared to the semiconductor device 2A.

Accordingly, the electric concentration on the vicinity of the lower end 57d of the field plate electrode 57 adjacent to the field plate electrode 56e is alleviated as compared to the semiconductor device 2A. That is, the breakdown voltage of the semiconductor device 2B is further improved as compared to the breakdown voltage of the semiconductor device 2A.

(Third Embodiment)

Figure 10A:
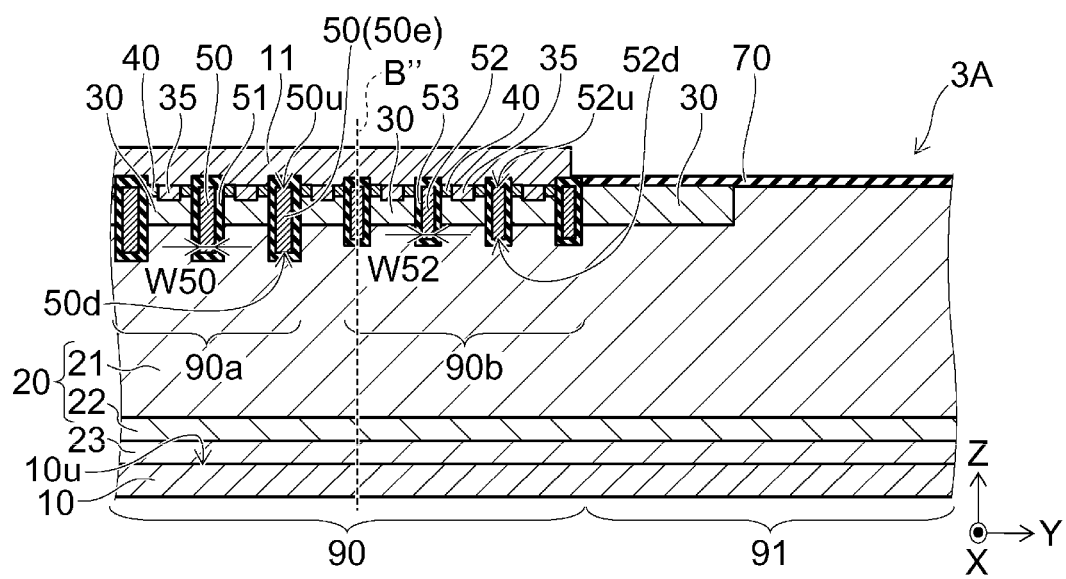
FIG. 10A is a cross-sectional view schematically depicting a semiconductor device according to a first example of a third embodiment.
Figure 10B:
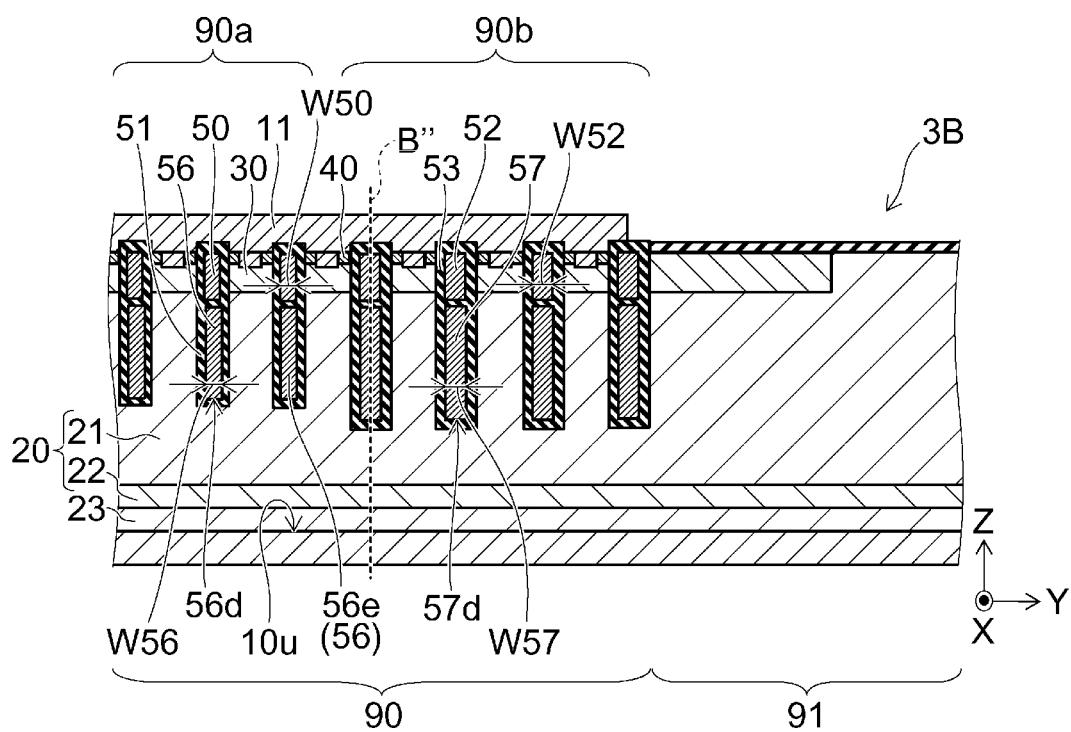
FIG. 10B is a cross-sectional view schematically depicting a semiconductor device according to a second example of the third embodiment.

FIG. 10A is a cross-sectional view schematically showing main parts of a semiconductor device according to a first example of a third embodiment, and FIG. 10B is a cross-sectional view schematically showing main parts of a semiconductor device according to a second example of the third embodiment.

A semiconductor device 3A shown in FIG. 10A includes the same elements as the semiconductor device 1A, and further includes a fourth $p^+$ type semiconductor region (hereinafter, for example, a collector region 23) between the drain region 22 of the semiconductor region 20 and the drain electrode 10.

A semiconductor device 3B shown in FIG. 10B includes the same elements as the semiconductor device 2A, and further includes the p$^+$ type collector region 23 between the drain region 22 of the semiconductor region 20 and the drain electrode 10.

That is, the semiconductor devices 3A and 3B are insulated gate bipolar transistors (IGBT) having an upper and lower electrode structure (vertical arrangement). Herein, in the third embodiment, the term "source" as used in conjunction with description of the semiconductor devices 2A and 2B is to be read as an "emitter", the "drain" is to be read as a "collector", and the "drift region" is to be read as a "base".

In the semiconductor device 3A, the distance between the lower end 52d of each gate electrode 52 and the drain (collector) electrode 10 increases as each successive gate electrode 52 as becomes farther from the plurality of gate electrodes 50 along the Y-direction.

In the semiconductor device 3B, the distance between the lower end 57d of each field plate electrode 57 and the upper surface 10u of the drain electrode 10 decreases as each successive field plate electrode 57 becomes farther from the plurality of gate electrodes 50 along the Y-direction.

(Fourth Embodiment)

Figure 11A:
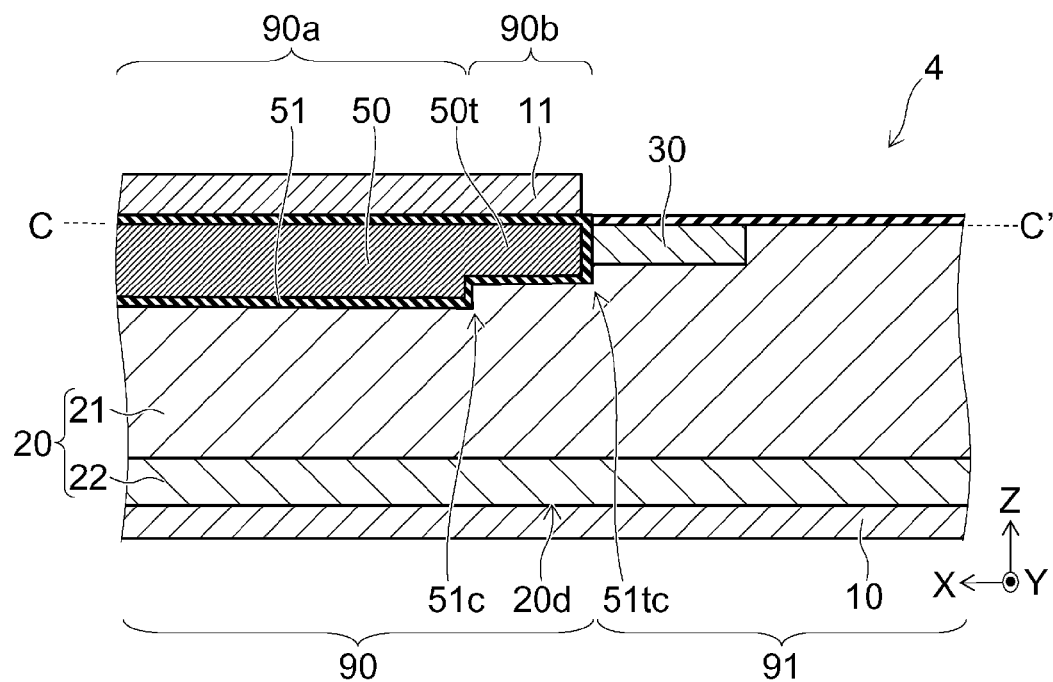
FIG. 11A is a cross-sectional view schematically depicting a semiconductor device according to a fourth embodiment.
Figure 11B:
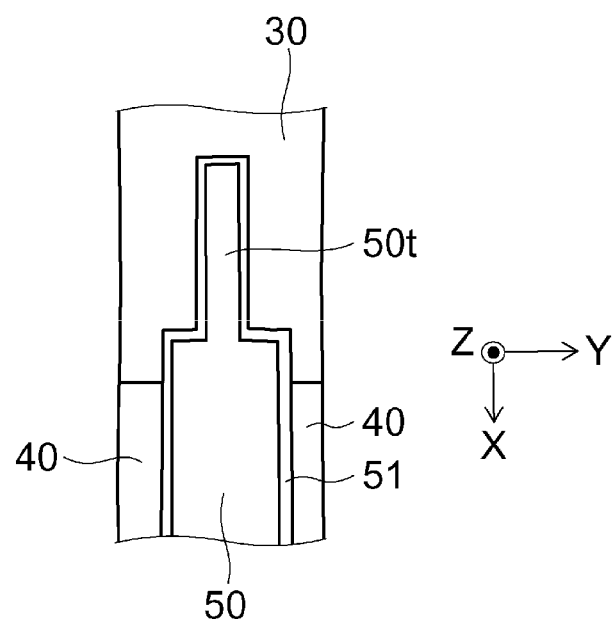
FIG. 11B is a schematic plan view as seen at a position along line C-C' of FIG. 11A.

FIG. 11A is a cross-sectional view schematically showing main parts of a semiconductor device according to a fourth embodiment. FIG. 11B is a schematic plan view seen at a position along line C-C' of FIG. 11A.

FIG. 11A shows a cross section of the semiconductor device 4 in the X-Z plane. The plurality of gate electrodes 50 extend in the X-direction and are arranged spaced from each other along the Y-direction. In the gate electrodes 50 of the semiconductor device 4, the lengths of the gate electrodes 50 in the Z direction become short in an end portion 50t. That is, the distance between the gate electrodes 50 and a lower surface 20d of the semiconductor region 20 becomes longer in the end portion 50t (see FIG. 11A).

In the semiconductor device 4, the widths of the gate electrodes 50 in the Y direction also become reduce in the end portion 50t (see FIG. 11B). In the fourth embodiment, the trenches formed before the gate electrodes 50 are provided are formed to be narrower in the end portion 50t than in middle portions. The loading effect during trench etching is used here, and the gate electrodes 50 are formed so the lengths (depths) of the gate electrodes 50 in the Z direction is reduced in the end portion 50t.

According to the semiconductor device 4, the lengths (depths) of the gate electrodes 50 in the Z direction are reduced in the end portion 50t. Accordingly, an electric field concentrated near a corner 51tc of the insulating film 51 coming in contact with the end portion 50t is alleviated as compared to an electric field concentrated to the corner 51c of the insulating film 51 in a portion other than the end portion 50t. Accordingly, the avalanche breakdown more easily occurs in the vicinity of the corner 51c as compared to the vicinity of the corner 51tc of the insulating film 51. That is, in the semiconductor device 4, the breakdown voltage of the drift region 21 in the element region 90b which is in the vicinity of the terminal end region 91 is also relatively improved in an X-Z cutting plane.

A distance between the portions of the gate electrode 50 not in the end portion 50t and the pn junction of the terminal end region 91 is longer than a distance between the end portion 50t of the gate electrode 50 and the pn junction of the terminal end region 91. Accordingly, the hot spot also rarely moves between the element region 90a and the terminal end region 91 in the X-Z cutting plane. That is, according to the semiconductor device 4, a phenomenon of the repeated movement of the hot spot is also prevented and the breakdown of the drift region 21 rarely occurs in the X-Z cutting plane.

According to the semiconductor device 4, the breakdown voltage of the drift region 21 in the element region 90b is also relatively improved in the X-Z cutting plane. Accordingly, in the X-Z cutting plane, it is not necessary to separately increase the thickness of the drift region 21 in the element region 90b. In addition, in the X-Z cutting plane, it is not necessary to provide a field plate electrode dedicated to alleviating the electric concentration at the corner 51tc of the insulating film 51. Therefore, according to the semiconductor device 4, the low manufacturing cost is realized.

In addition, according to the semiconductor device 4, the end portion 50t of the gate electrodes 50 provided in the element region 90b functions as a control electrode which controls the electric connection. Therefore, in the on state, on resistance of the semiconductor device 4 does not decrease and large current is ensured.

The semiconductor device 4 includes the p$^+$ type collector region 23 between the semiconductor region 20 and the drain (collector) electrode 10 and may be an IGBT.

(Fifth Embodiment)

Figure 12A:
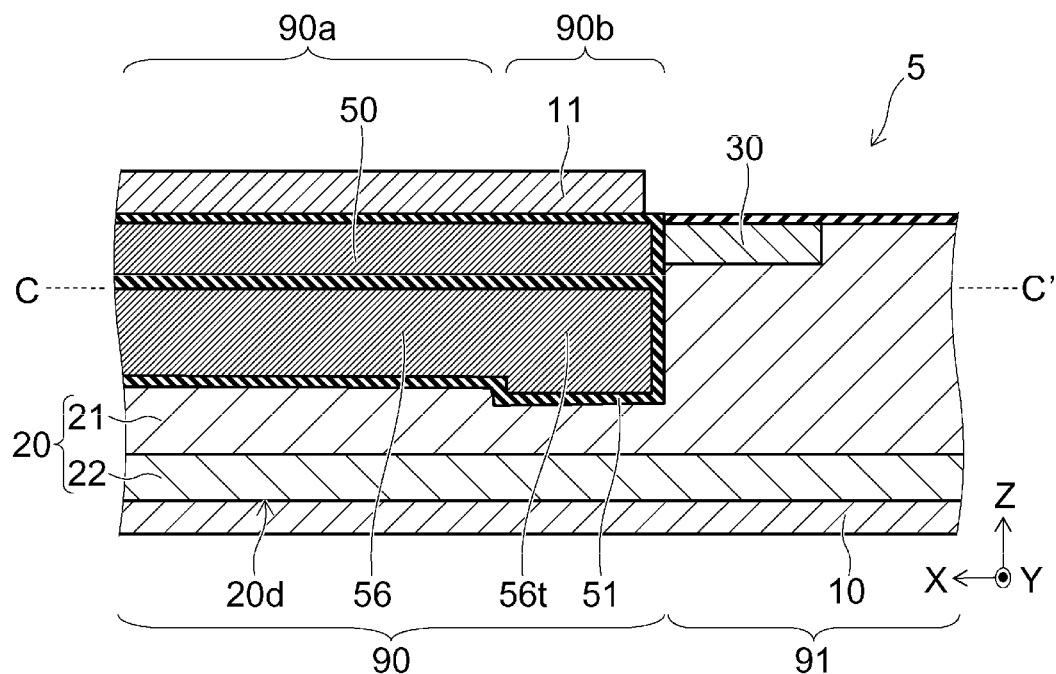
FIG. 12A is a cross-sectional view schematically depicting a semiconductor device according to a fifth embodiment.
Figure 12B:
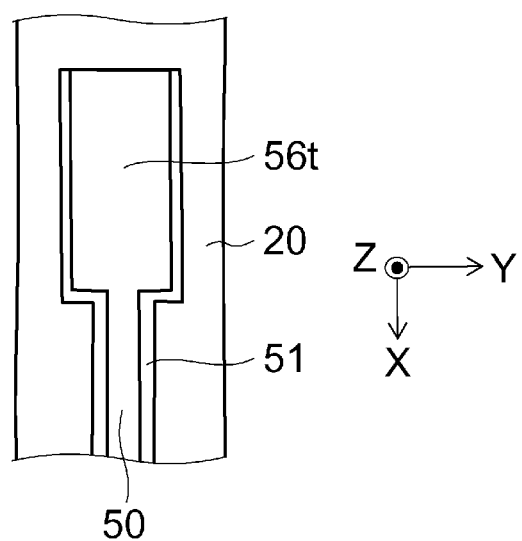
FIG. 12B is a schematic plan view as seen at a position along line C-C' of FIG. 12A.

FIG. 12A is a cross-sectional view schematically showing main parts of a semiconductor device according to a fifth embodiment. FIG. 12B is a schematic plan view seen at a position along line C-C' of FIG. 12A.

FIG. 12A shows a cross section of a semiconductor device 5 in the X-Z plane. A plurality of field plate electrodes 56 extend in a direction (for example, X direction) intersecting with a direction (for example, Y direction) in which the plurality of field plate electrodes 56 are arranged parallel to each other.

In the field plate electrodes 56 of the semiconductor device 5, the lengths of the field plate electrodes 56 in the Z direction selectively increases in an end portion 56t. That is, the distance between any of plurality of field plate electrodes 56 and the lower surface 20d of the semiconductor region 20 is reduced in the end portion 56t of the plurality of field plate electrodes 56 (see FIG. 12A).

In the semiconductor device 5, the widths of the field plate electrodes 56 in the Y direction increases in the end portion 56t (see FIG. 12B). In the fifth embodiment, the trenches formed before the field plate electrodes 56 are provided, are formed to be wider in the end portion 56t and the loading effect is used during etching to provide the different trench portion depths. That is, the field plate electrodes 56 are formed so the lengths (depths) of the field plate electrodes 56 in the Z direction are increased in the end portion 56t.

In the semiconductor device 5, the lengths (depths) of the field plate electrodes 56 in the Z direction are greater in the end portion 56t. That is, in the semiconductor device 5, in the X-Z cutting plane, the depletion layer of the drift region 21 in the element region 90b more easily extends as compared to the depletion layer of the drift region 21 in the element region 90a.

Accordingly, in the semiconductor device 5, the breakdown voltage of the drift region 21 in the element region 90b also increases in the X-Z cutting plane as compared to the breakdown voltage of the drift region 21 in the element region 90a. Accordingly, in the X-Z cutting plane, the avalanche breakdown more easily occurs in the drift region 21 in the element region 90a as compared to the drift region 21 in the element region 90b.

Herein, the distance between the field plate electrode 56 except for the end portion 56t and the pn junction of the terminal end region 91 is longer than the distance between the end portion 56t of the field plate electrode 56 and the pn junction of the terminal end region 91. Accordingly, in the semiconductor device 5, the hot spot also rarely moves between the element region 90a and the terminal end region 91 in the X-Z cutting plane. As described above, according to semiconductor device 5, a phenomenon of the repeated movement of the hot spot is also prevented and the breakdown of the drift region 21 rarely occurs in the X-Z cutting plane.

According to the semiconductor device 5, the breakdown voltage of the drift region 21 in the element region 90 is also relatively improved in the X-Z cutting plane. Therefore, according to the semiconductor device 5, low manufacturing cost is realized.

In the embodiments described above, the term "on" as used in the expression "an element A is provided on an element B" may be used to describe a case where the element A does not come into direct contact with the element B and the element A is provided over the element B, in addition to a case where the element A comes in contact with the element B and the element A is provided over the element B. In addition, the expression "an element A is provided on an element B" may also be used in a case where the spatial arrangement of the element A and the element B are reversed and the element A is positioned under the element B or a case where the element A and the element B are arranged side by side. This is because the structure of the semiconductor device does not change when the semiconductor device according to the embodiment is rotated in space.

Hereinabove, the embodiments are described with reference to specific examples. However, the embodiments of the present disclosure are not limited to these specific examples.

Each element included in each embodiment described above may be combined with each other as long as it may be technically realized, and the combinations are also included in the range of the disclosure, as long as the combinations include the features of the embodiments. In addition, in the scope of the present disclosure is not limited to the specific examples, and includes various modifications and variants to the embodiments which would be apparent to a person of ordinary skill in the art upon review of the present disclosure, and it is to be understood that these modifications and variants are within the scope of the present disclosure.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
    an element region and a terminal region surrounding the element region in a first plane;
    a first semiconductor region having a first conductivity type;
    a second semiconductor region having a second conductivity type and provided on the first semiconductor region;
    a third semiconductor region having the first conductivity type and provided on the second semiconductor region;
    a first electrode that is electrically connected to the first semiconductor region;
    a second electrode that is electrically connected to the third semiconductor region;
    a third electrode in the element region and adjacent to the first semiconductor region, the second semiconductor region, and the third semiconductor region through a first insulating film; and
    a fourth electrode having a plurality of portions in the element region between the third electrode and the terminal region along a first direction parallel to the first plane, the fourth electrode adjacent to the first semiconductor region, the second semiconductor region, and the third semiconductor region through a second insulating film, the plurality of portions of the fourth electrode being arranged in parallel and spaced from each other along the first direction, wherein
    a first distance along a second direction crossing the first plane from the first electrode to the third electrode is less than a second distance along the second direction from the first electrode to the fourth electrode, and
    a depth along the second direction of each successive portion of the fourth electrode is less than a depth of each preceding portion of the fourth electrode from the element region towards the terminal region along the first direction.

2. The semiconductor device according to claim 1, wherein a width along the first direction of the third electrode is greater than a width along the first direction of the fourth electrode.

3. The semiconductor device according to claim 1, further comprising:
    a fifth electrode in the element region between the fourth electrode and the terminal region along the first direction, wherein
    a third distance along the second direction from the first electrode to the fifth electrode is greater than the second distance.

4. The semiconductor device according to claim 1, further comprising:
    a plurality of third electrodes in the element region arranged in parallel and spaced from each other along the first direction.

5. The semiconductor device according to claim 1, wherein the third electrode extends along a third direction parallel to the first plane, and a distance along the second direction from the first electrode to an end portion of the third electrode adjacent in the third direction to the terminal region is greater than the first distance.

6. The semiconductor device according to claim 5, wherein the third electrode has a width along the first direction which decreases in the end portion of the third electrode.

7. A semiconductor device, comprising:
    a plurality of first gate electrodes spaced from each other in a first direction parallel to a first surface of semiconductor layer, each first gate electrode extending into the semiconductor layer in a second direction crossing the first surface and along a third direction parallel to the first surface; and
    a plurality of second gate electrodes spaced from each other in the first direction, each second gate electrode extending into the semiconductor layer in the second direction and along the third direction, the plurality of second gate electrodes disposed between, along the first direction, the plurality of first gate electrodes and a terminal region of the semiconductor layer, wherein each second gate electrode extends for a distance into the semiconductor layer along the second direction that is less than a distance to which each first gate electrode extends into the semiconductor layer along the second direction, and the distance into the semiconductor layer along the second direction to which each second gate electrode extends varies along the first direction.

8. The semiconductor device according to claim 7, wherein a width of each second gate electrode along the first direction is less than a width of each first gate electrode along the first direction.

9. The semiconductor device according to claim 7, wherein the semiconductor device is a vertical metal-oxide-semiconductor field effect transistor device.

10. A semiconductor device, comprising:
- an element region and a terminal region surrounding the element region in a first plane;
- a first semiconductor region having a first conductivity type;
- a second semiconductor region having a second conductivity type and provided on the first semiconductor region;
- a third semiconductor region having the first conductivity type and provided on the second semiconductor region;
- a first electrode that is electrically connected to the first semiconductor region;
- a second electrode that is electrically connected to the third semiconductor region;
- a third electrode in the element region and adjacent to the first semiconductor region, the second semiconductor region, and the third semiconductor region through a first insulating film; and
- a plurality of fourth electrodes in the element region between the third electrode and the terminal region along a first direction parallel to the first plane, the plurality of fourth electrodes arranged in parallel and spaced from each other along the first direction, the plurality of fourth electrodes being adjacent to the first semiconductor region, the second semiconductor region, and the third semiconductor region through a second insulating film, wherein
- a first distance along a second direction crossing the first plane from the first electrode to the third electrode is less than a second distance along the second direction from the first electrode to the fourth electrode, and
- a depth along the second direction of each successive fourth electrode in the plurality is less than a depth of each preceding fourth electrode in the plurality from the element region towards the terminal region along the first direction.

* * * * *